United States Patent
Wu et al.

(10) Patent No.: US 10,395,916 B2
(45) Date of Patent: Aug. 27, 2019

(54) IN-SITU PRE-CLEAN FOR SELECTIVITY IMPROVEMENT FOR SELECTIVE DEPOSITION

(71) Applicant: Applied Materials, Inc., Santa Clara, CA (US)

(72) Inventors: Kai Wu, Palo Alto, CA (US); Vikash Banthia, Los Altos, CA (US); Sang Ho Yu, Cupertino, CA (US); Mei Chang, Saratoga, CA (US); Feiyue Ma, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/699,110

(22) Filed: Sep. 8, 2017

(65) Prior Publication Data

US 2018/0076020 A1    Mar. 15, 2018

Related U.S. Application Data

(60) Provisional application No. 62/393,022, filed on Sep. 10, 2016.

(51) Int. Cl.
| | |
|---|---|
| H01L 21/02 | (2006.01) |
| H01L 21/285 | (2006.01) |
| H01L 23/532 | (2006.01) |
| H01L 21/768 | (2006.01) |

(52) U.S. Cl.
CPC .. *H01L 21/02074* (2013.01); *H01L 21/02068* (2013.01); *H01L 21/02697* (2013.01); *H01L 21/28556* (2013.01); *H01L 21/28568* (2013.01); *H01L 21/768* (2013.01); *H01L 23/53209* (2013.01)

(58) Field of Classification Search
None
See application file for complete search history.

(56) References Cited

U.S. PATENT DOCUMENTS

| | | | |
|---|---|---|---|
| 5,906,866 | A | 5/1999 | Webb |
| 6,372,301 | B1 | 4/2002 | Narasimhan et al. |
| 9,105,695 | B2 | 8/2015 | Shek et al. |
| 9,275,865 | B2 | 3/2016 | Wang et al. |
| 9,805,974 | B1 * | 10/2017 | Chen ................ H01L 21/32051 |
| 2009/0269507 | A1 | 10/2009 | Yu et al. |
| 2011/0244680 | A1 | 10/2011 | Tohnoe et al. |
| 2012/0199887 | A1 * | 8/2012 | Chan .................... C23C 16/0281 257/288 |

(Continued)

FOREIGN PATENT DOCUMENTS

JP    2001524261 A    11/2001

OTHER PUBLICATIONS

PCT International Search Report and Written Opinion in PCT/US2017/050687 dated Dec. 26, 2017, 11 pages.

*Primary Examiner* — Asok K Sarkar
(74) *Attorney, Agent, or Firm* — Servilla Whitney LLC (57) ABSTRACT

Methods to selectively deposit a film on a first surface (e.g., a metal surface) relative to a second surface (e.g., a dielectric surface) by exposing the surface to a pre-clean plasma comprising one or more of argon or hydrogen followed by deposition. The first surface and the second surface can be substantially coplanar. The selectivity of the deposited film may be increased by an order of magnitude relative to the substrate before exposure to the pre-cleaning plasma.

20 Claims, 3 Drawing Sheets

(56) References Cited

U.S. PATENT DOCUMENTS

2013/0196502 A1 8/2013 Haukka et al.
2015/0380272 A1 12/2015 Wu et al.
2016/0118296 A1 4/2016 Kolics et al.

* cited by examiner

IN-SITU PRE-CLEAN FOR SELECTIVITY IMPROVEMENT FOR SELECTIVE DEPOSITION

CROSS-REFERENCE TO RELATED APPLICATIONS

This application claims priority to U.S. Provisional Application No. 62/393,022, filed Sep. 10, 2016, the entire disclosure of which is hereby incorporated by reference herein.

FIELD

Embodiments of the disclosure generally relate to methods of selectively depositing a film. More particularly, embodiments of the disclosure are directed to methods of selectively depositing a film an in-situ plasma.

BACKGROUND

Tungsten has been widely used in multiple levels in logic and memory devices. Typically, CVD W processes provide conformal tungsten film growth on the substrate where nucleation has started. As the device scaling continues, there are new applications and integrations, such as cobalt capping for cobalt contacts, and copper capping for backend, that may use selective tungsten growth only on certain area of the pattern.

During the process flow integration, selective tungsten processes may lose selectivity due to the prior processing steps. For example, on a patterned surface after chemical-mechanical planarization (CMP), severe selectivity loss from >50:1 to <5:1 has been observed between metal and dielectric surface.

For some selective cobalt process, an in-situ passivation process using a surfactant has been developed to improve selectivity. The passivation layer formed only reacts on dielectric surfaces instead of copper surface, so cobalt can only grow on copper substrate instead of on the passivated dielectric, therefore selectivity is significantly improved. However, current surfactants will not only passivate the dielectric surface but also the cobalt surface. Therefore, tungsten cannot grow on the cobalt surface either, leaving no tungsten growth at all.

Therefore, there is a need in the art for methods of selectively depositing a film onto one surface selectively over a different surface.

SUMMARY

One or more embodiments of the disclosure are directed to methods of selectively depositing a film. A substrate having a first surface and a second surface different from the first surface is provided. The substrate is exposed to a pre-clean plasma comprising one or more of argon or hydrogen to form a pre-cleaned substrate. A metal film is selectively deposited on the first surface of the pre-cleaned substrate relative to the second surface.

Additional embodiments of the disclosure are directed to methods of selectively depositing a film. A substrate having a metal surface and a dielectric surface is provided. The metal surface and the dielectric surface are substantially coplanar. The substrate is exposed to a pre-clean plasma to form a pre-cleaned substrate. The pre-clean plasma comprises one or more of argon or hydrogen at a pressure in the range of about 10 mTorr to about 1 Torr. The pre-cleaned substrate is exposed to deposition conditions to deposit a metal film. The metal film is deposited with a selectivity of greater than or equal to about 50:1 on the metal surface relative to the dielectric surface.

Further embodiments of the disclosure are directed to methods of selectively depositing a film. A substrate having a cobalt surface and a dielectric surface that are substantially coplanar is provided. The substrate is exposed to a pre-clean plasma to form a pre-cleaned substrate. The pre-clean plasma comprises one or more of argon or hydrogen at a pressure in the range of about 10 mTorr to about 1 Torr and a temperature about room temperature. The pre-cleaned substrate is exposed to deposition conditions to deposit a tungsten film with a selectivity of greater than or equal to about 50:1 on the cobalt surface relative to the dielectric surface. The deposition conditions comprise a thermal CVD process using $WF_6/H_2$ at a temperature in the range of about 200° C. to about 300° C.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Embodiments of the disclosure provide methods to improve selectivity of a metal deposition process (e.g., tungsten) in the integration flow, such as post-chemical mechanical planarization (CMP), using an in-situ pre-clean process. The pre-clean process of some embodiments comprises exposure to an Ar and/or $H_2$ plasma to selectively remove surface damage/contamination from the dielectric after CMP and also remove/reduce oxides on the metal surface so that a metal can be deposited on one surface relative to the other surface. The plasma pressure can be in the range of about 10 mTorr to about 1 Torr. A bias can be applied to improve selectivity and minimize/eliminate metal lateral growth. After the in-situ pre-clean, selectivity can be recovered to a level greater than or equal to about 50:1. Embodiments of the method can be used for capping layers for metal interconnects, capping on top of metal vias for post-CMP defect reduction, bottom-up gapfill applications, and other processes.

As used in this specification and the appended claims, the term "substrate" and "wafer" are used interchangeably, both referring to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. What a given substrate surface comprises will depend on what films are to be deposited, as well as the particular chemistry used. In one or more embodiments, the first substrate surface will comprise a metal, and the second substrate surface will comprise a dielectric, or vice versa. In some embodiments, a substrate surface may comprise certain functionality (e.g., —OH, —NH, etc.).

As used in this specification and the appended claims, the terms "reactive gas", "precursor", "reactant", and the like, are used interchangeably to mean a gas that includes a species which is reactive with a substrate surface. For example, a first "reactive gas" may simply adsorb onto the surface of a substrate and be available for further chemical reaction with a second reactive gas.

Embodiments of the disclosure provide methods of selectively depositing a metal film onto one surface over a second surface. As used in this specification and the appended claims, the term "selectively depositing" a film on one surface over another surface, and the like, means that a first amount of the film is deposited on the first surface and a second amount of film is deposited on the second surface, where the second amount of film is less than the first amount of film or none. The term "over" used in this regard does not imply a physical orientation of one surface on top of another surface, rather a relationship of the thermodynamic or kinetic properties of the chemical reaction with one surface relative to the other surface. For example, selectively depositing a cobalt film onto a copper surface over a dielectric surface means that the cobalt film deposits on the copper surface and less or no cobalt film deposits on the dielectric surface; or that the formation of the cobalt film on the copper surface is thermodynamically or kinetically favorable relative to the formation of a cobalt film on the dielectric surface. Stated differently, the film can be selectively deposited onto a first surface relative to a second surface means that deposition on the first surface is favorable relative to the deposition on the second surface.

Figure 1:
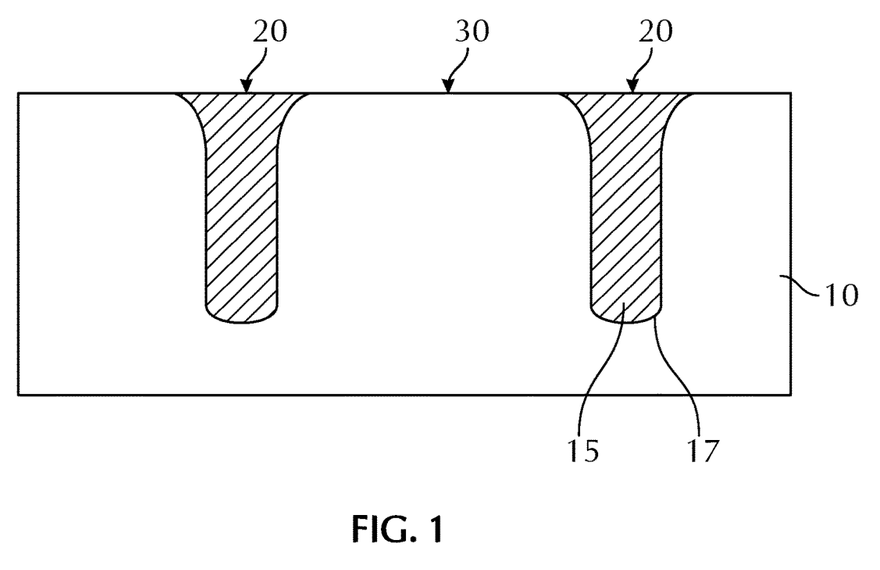
FIG. 1 shows a schematic cross-sectional view of a substrate with a first surface and a second surface in accordance with one or more embodiment of the disclosure.

Embodiments of the disclosure are directed to methods of selectively depositing a film. FIG. 1 shows a schematic cross-sectional view of a substrate 10 with a first surface 20 and a second surface 30. For example, the substrate 10 shown is a dielectric material so that the second surface 30 is a dielectric surface. A channel 17 in the substrate 10 is filled with a first material 15, for example, a metal. The surface of the first material 15 provides the first surface 20.

The first surface 20 and the second surface 30 can have chemistries different than the bulk chemistry of the material forming the surface. For example, the first material 15 can be a metal (e.g., cobalt) while the first surface 20 may be an oxidized cobalt. The surface chemistry of the first surface 20 and the second surface 30 can be affected by previous processing on the substrate. For example, a chemical-mechanical planarization (CMP) process may cause the surfaces to become oxidized, contaminated or damaged. The oxidation, contamination or damage to the surface can result in the loss in selectivity.

In some embodiments, as shown in FIG. 1, the first surface and the second surface are substantially coplanar. Those skilled in the art will understand that substantially coplanar means that the major planes formed by individual surface are within about the same plane. As used in this regard, "substantially coplanar" means that the plane formed by the first surface is within ±100 µm of the plane formed by the second surface, measured at the boundary between the first surface and the second surface. In some embodiments, the planes formed by the first surface and the second surface are within ±500 µm, ±400 µm, ±300 µm, ±200 µm, ±100 µm, ±50 µm, ±10 µm, ±5 µm, ±1 µm, ±500 nm, ±250 nm, ±100 nm, ±50 nm, ±10 nm, ±1 nm or ±0.1 nm.

In some embodiments, the substrate 10 has been subjected to a chemical-mechanical planarization (CMP) process. The surface of the substrate, including the first surface and the second surface, may have a root-mean-square (RMS) roughness less than or equal to about 100 nm, 50 nm, 10 nm, 1 nm, 0.5 nm or 0.1 nm.

Figure 2:
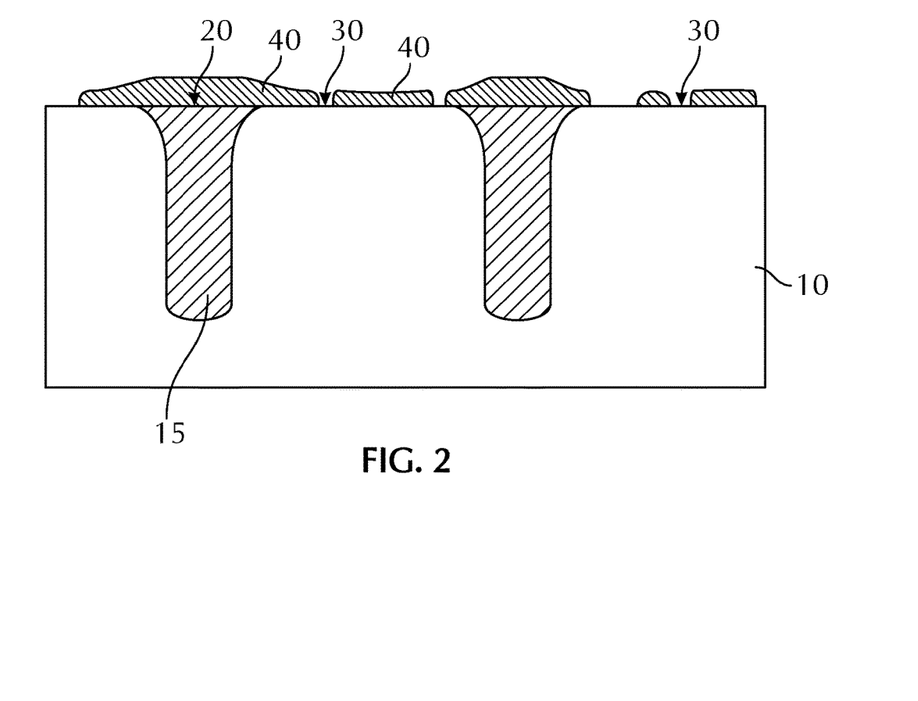
FIG. 2 shows a schematic cross-sectional view of the substrate of FIG. 1 with a metal film deposited thereon without pre-cleaning.

FIG. 2 shows a schematic cross-sectional view of the substrate of FIG. 1 with a metal film 40 deposited thereon. The selectivity of the metal film 40 is poor, with large areas or domains deposited on the second surface 30 and the first surface 20. Embodiments of the disclosure provide in-situ methods to improve the selectivity of the metal film 40. As used in this manner, "in-situ" means that the substrate is not exposed to air between pre-cleaning and deposition of the metal film. For example, the substrate may be positioned in the same processing chamber for pre-cleaning and film deposition. In some embodiments, the substrate remains under load-lock conditions for the pre-cleaning and film deposition, for example, in a cluster tool.

Figure 3:
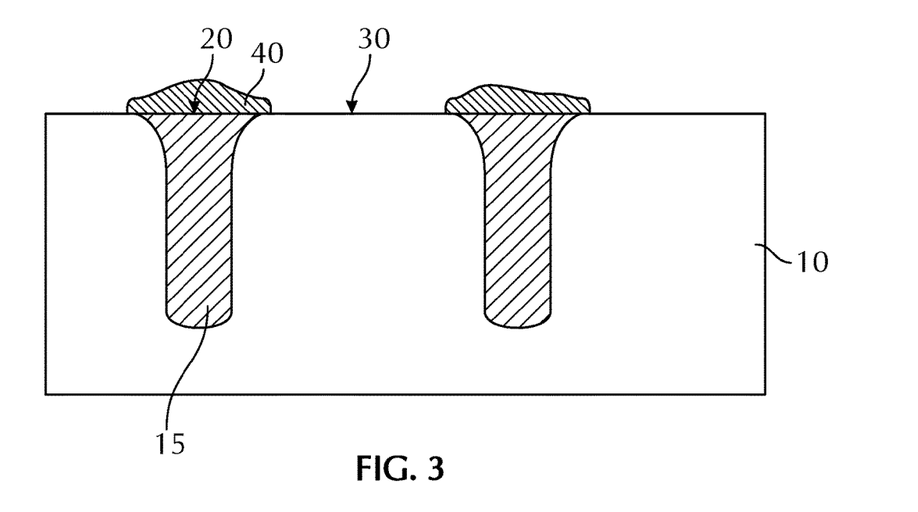
FIG. 3 shows a schematic cross-sectional view of the substrate of FIG. 1 with a metal film deposited thereon with pre-cleaning in accordance with one or more embodiment of the disclosure.

FIG. 3 shows a schematic cross-sectional view of the substrate of FIG. 1 with a metal film 40 deposited thereon after the first surface 20 and second surface 30 have been exposed to the pre-cleaning process. The selectivity of the metal film 40 for the first surface 20 is much greater than in FIG. 2 where no pre-cleaning process was performed.

To increase the selectivity, the substrate is exposed to a pre-cleaning process. The term "pre-clean" means prior to deposition of the metal film on the surface without additional intervening processing steps (e.g., deposition, annealing, polishing). The pre-clean process comprises exposing the substrate to a pre-clean plasma. The pre-clean plasma comprises one or more of argon or hydrogen. In some embodiments, the pre-clean plasma comprises argon. In some embodiments, the pre-clean plasma comprises hydrogen. In some embodiments, the pre-clean plasma comprises a mixture of hydrogen and argon. In some embodiments, the pre-clean plasma consists essentially of argon. In some embodiments, the pre-clean plasma consists essentially of hydrogen. In some embodiments, the pre-clean plasma consists essentially of a combination of hydrogen and argon. As used in this regard, the term "consists essentially of" means than the active plasma species is greater than or equal to about 95 atomic % of the stated component. In some embodiments, the pre-clean plasma is greater than or equal to about 96, 97, 98 or 99 atomic percent of the stated component.

The conditions of the pre-clean plasma can be modified depending on the specific surfaces being cleaning. The pressure of the pre-clean plasma in some embodiments is in the range of about 10 mTorr to about 30 Torr, or in the range of about 10 mTorr to about 10 Torr, or in the range of about 20 mTorr to about 5 Torr, or in the range of about 30 mTorr to about 1 Torr. The temperature during pre-cleaning in some embodiments is in the range of about 0° C. to about 400° C., or in the range of about room temperature to about 400° C., or in the range of about room temperature to about 350° C., or in the range of about room temperature to about 300° C., or in the range of about room temperature to about 250° C. As used in this specification and the appended claims, the term "room temperature" refers to a temperature in the range of about 20° C. to about 25° C. In some embodiments, the temperature of the pre-clean plasma is about room temperature.

In some embodiments, the pre-clean plasma includes a bias component applied to the substrate to cause more directionality to the plasma species. For example a bias of 2 MHz applied to the wafer (or pedestal or wafer support) may improve the selectivity of the metal film deposition by decreasing the amount of lateral film deposition.

After the first surface and the second surface have been pre-cleaned, a metal film 40 is deposited selectively on the first surface 20 relative to the second surface 30, as shown in FIG. 3. In some embodiments, substantially none of the metal film 40 deposits on the second surface 30. As used in this regard, "substantially none" means that less than about 5%, 4%, 3%, 2% or 1% of the metal film is deposited on the second surface, as a total weight of the metal film.

The selectivity of the metal film in greater than that of a film deposited by the same conditions on a substrate that has not been exposed to the pre-clean plasma. In some embodiments, the metal film has a selectivity greater than or equal to about 40:1, 45:1, 50:1, 55:1, 60:1 or higher. In some embodiments, the selectivity of the metal film is increased by 5×, 6×, 7×, 8×, 9×, 10× or more. For example, the selectivity of the metal film on a pre-cleaned surface may be an order of magnitude (10×) greater than the selectivity of the metal film of a surface that has not been pre-cleaned, where the surfaces have otherwise the same components.

In some embodiments, the first surface 20 is a metal surface and the second surface 30 is a dielectric surface. In one or more embodiments, the metal of the metal surface comprises one or more of cobalt, copper, tungsten or ruthenium. The pre-clean plasma of various embodiments removes or reduces the amount of oxides from the surface of the metal surface The metal film 40 deposited can be any suitable metal film. In some embodiments, the metal film comprises one or more of tungsten, cobalt or copper. In one or more embodiments, the metal film 40 consists essentially of tungsten. As used in this regard, the term "consists essentially of" means that the metal film is greater than or equal to about 95 atomic percent of the specified component. In some embodiments, the metal film is greater than about 96, 97, 98 or 99 atomic percent of the specified component.

In one or more embodiments, the metal film 40 comprises tungsten. The tungsten can be deposited by a chemical vapor deposition (CVD) process using a suitable tungsten precursor and reactant or by thermal decomposition of a suitable tungsten precursor. In some embodiments, the metal film 40 is deposited by an atomic layer deposition (ALD) process in which at least a portion of the substrate is sequentially exposed to a suitable metal precursor and a reactant (e.g., a reducing agent).

Suitable tungsten precursors include, but are not limited to, tungsten halides, organic tungsten and organometallic tungsten complexes. In some embodiments, the tungsten precursor comprises one or more of $WF_6$, $WCl_6$ or $WCl_5$. In some embodiments, the tungsten precursor comprises $WF_6$ and the reactant comprises $H_2$.

Suitable co-reactants for a CVD or ALD process include, but are not limited to, silane ($SiH_4$), borane ($B_2H_6$), hydrogen ($H_2$), plasmas thereof or combinations thereof. In some embodiments, the reactant comprises hydrogen. In some embodiments, the reactant comprises silane. In some embodiments, the reactant comprises borane. In some embodiments, the reactant consists essentially of hydrogen. As used in this manner, the term "consists essentially of" means that the reactive component in the reactant gas (not including diluent, carrier or inert species) is greater than or equal to about 95%, 98% or 99% of the stated compound. In some embodiments, the reactant consists essentially of silane. In some embodiments, the reactant consists essentially of borane.

In some embodiments, the metal film 40 is deposited using a combination of organometallic precursors and metal halide precursors, having the same or different metals. For example, an organometallic tungsten complex can be reacted with a tungsten halide to form a tungsten film. The organometallic precursor and metal halide precursor can form the metal film 40 by CVD or ALD, with or without additional reactants (e.g., reducing agents).

In some embodiments, the deposition process occurs at a temperature in the range of about 150° C. to about 500° C., or in the range of about 175° C. to about 400° C., or in the range of about 200° C. to about 300° C. In one or more embodiments, the deposition process is a thermal process which occurs without plasma enhancement.

Depositing the metal film 40 on the substrate can include moving the substrate from a pre-clean chamber to a deposition chamber. In some embodiments, pre-clean chamber and the deposition chamber are the same chamber. In some embodiments, the pre-clean chamber and the deposition chamber are different chambers. In some embodiments, the pre-clean chamber and the deposition chamber are integrated so that moving the substrate from the pre-clean chamber to the deposition chamber does not expose the substrate to air or oxygen.

Figure 4:
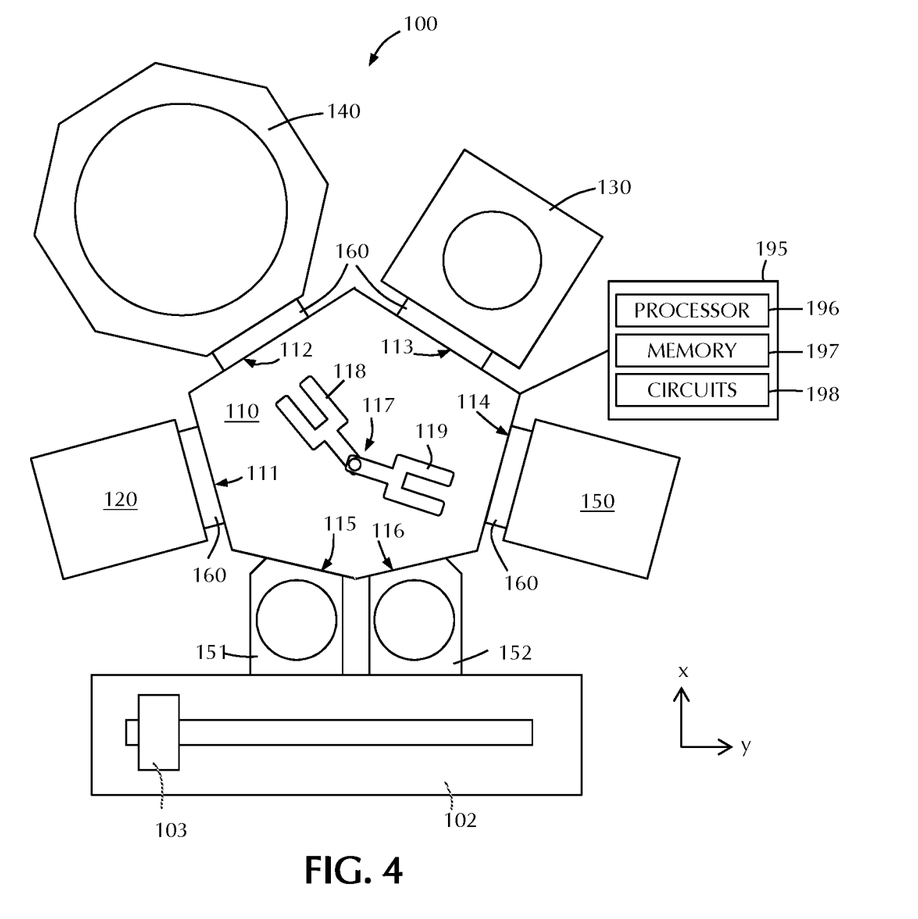
FIG. 4 shows a processing system in accordance with one or more embodiment of the disclosure.

FIG. 4 shows a processing platform 100 in accordance with one or more embodiment of the disclosure. The embodiment shown in FIG. 4 is merely representative of one possible configuration and should not be taken as limiting the scope of the disclosure. For example, in some embodiments, the processing platform 100 has different numbers of process chambers, buffer chambers and/or robot configurations.

The processing platform 100 includes a central transfer station 110 which has a plurality of sides 111, 112, 113, 114, 115, 116. The central transfer station 110 shown has a first side 111, a second side 112, a third side 113, a fourth side 114, a fifth side 115 and a sixth side 116. Although six sides are shown, those skilled in the art will understand that there can be any suitable number of sides to the central transfer station 110 depending on, for example, the overall configuration of the processing platform 100.

The transfer station 110 has a robot 117 positioned therein. The robot 117 can be any suitable robot capable of moving a wafer during processing. In some embodiments, the robot 117 has a first arm 118 and a second arm 119. The first arm 118 and second arm 119 can be moved independently of the other arm. The first arm 118 and second arm 119 can move in the x-y plane and/or along the z-axis. In some embodiments, the robot 117 includes a third arm or a fourth arm (not shown). Each of the arms can move independently of other arms.

The processing platform 100 includes a pre-clean chamber 120 connected to a first side 111 of the central transfer station 110. The pre-clean chamber 120 is configured to expose one or more substrates to the pre-clean process described herein.

After the substrate has been cleaned in the pre-clean chamber 120, the substrate can be moved to another chamber for deposition. The processing platform 100 shown in FIG. 4 includes two deposition chambers: a single wafer processing chamber 130 and a batch processing chamber 140. Either of the single wafer processing chamber 130 and the batch processing chamber 140 can be a CVD and/or an ALD processing chamber.

In the illustrated embodiment, the batch processing chamber 140 is connected to a second side 112 of the central transfer station 110 and the single wafer processing chamber 130 is connected to a third side 113 of the central transfer station 110. The batch processing chamber 140 can be configured to process x wafers at a time for a batch time. In some embodiments, the batch processing chamber 140 can be configured to process in the range of about four (x=4) to about 12 (x=12) wafers at the same time. In some embodiments, the batch processing chamber 140 is configured to process six (x=6) wafers at the same time. As will be understood by the skilled artisan, while the batch processing chamber 140 can process multiple wafers between loading/unloading of an individual wafer, each wafer may be subjected to different process conditions at any given time. For example, a spatial atomic layer deposition chamber exposes the wafers to different process conditions in different processing regions within the processing chamber so that as a wafer is moved through each of the regions, the process is completed.

In the embodiment shown in FIG. 4, the processing platform 100 includes a second pre-clean chamber 150 connected to a fourth side 114 of the central transfer station 110. The second pre-clean chamber 150 can be the same as the pre-clean chamber 120 or different.

The processing platform 100 can also include a first buffer station 151 connected to a fifth side 115 of the central transfer station 110 and/or a second buffer station 152 connected to a sixth side 116 of the central transfer station 110. The first buffer station 151 and second buffer station 152 can perform the same or different functions. For example, the buffer stations may hold a cassette of wafers which are processed and returned to the original cassette, or the first buffer station 151 may hold unprocessed wafers which are moved to the second buffer station 152 after processing. In some embodiments, one or more of the buffer stations are configured to pre-treat, pre-heat or clean the wafers before and/or after processing.

The processing platform 100 may also include one or more slit valves 160 between the central transfer station 110 and any of the processing chambers. In the embodiment shown, there is a slit valve 160 between each of the chambers and the central transfer station 110. The slit valves 160 can open and close to isolate the environment within the processing chamber from the environment within the central transfer station 110. For example, if the processing chamber will generate plasma during processing, it may be helpful to close the slit valve for that processing chamber to prevent stray plasma from damaging the robot in the transfer station.

The processing platform 100 can be connected to a factory interface 102 to allow wafers or cassettes of wafers to be loaded into the processing platform 100. A robot 103 within the factory interface 102 can be moved the wafers or cassettes into and out of the buffer stations 151, 152. The wafers or cassettes can be moved within the processing platform 100 by the robot 117 in the central transfer station 110. In some embodiments, the factory interface 102 is a transfer station of another cluster tool.

The processing platform 100 can include a control system 195 connected to one or more of the robot 117, the pre-clean chamber 120, the pre-clean chamber 150, the single wafer processing chamber 130, the batch processing chamber 140, the buffer stations 151, 152, the slit valves 160, the factory interface 102 or the robot 103 inside the factory interface 102. The control system 195 can be any suitable controller and may include a processor 196 coupled with a memory 197 configured to enable the processing of one or more substrates. For example, the processor 196 may be configured with executable instructions stored in the memory 197 to enable operations of the pre-clean chamber 120, 150, the single wafer processing chamber 130, the batch processing chamber 140 and/or the central transfer station 110 as described herein.

The control system 195 can be configured to move substrates between and among the central transfer station 110, the pre-clean chamber 120, 150, the batch processing chamber 140 and the single wafer processing chamber 130. The control system 195 can move the substrates using a first arm 118 or a second arm 119 of the robot 117. The control system 195 can be configured to control the slit valves 160. It will be understood by those skilled in the art that the control system 195 does not move the arms 118, 119 of the robot 117 directly; rather, the control system 195 causes the arms 118, 119 of the robot 117 to move the substrates using electrical signals that control motors and/or actuators associated with the various system components to achieve movement. Similarly, those skilled in the art will understand that the control system 195 does not pre-clean the substrate or deposit a film on the substrates; rather, the control system 195 coordinates and provides electrical signals to appropriate components to cause gases to flow, plasma to be ignited, heating/cooling, etc., to achieve the cleaning and/or deposition.

The control system 195 can be configured to control at least one of composition, flow rate and/or pressure of the cleaning gas. The control system 195 can be configured to control the ignition of a plasma in the pre-clean chamber. The control system 195 can be configured to control the temperature of the substrate in the pre-clean chamber or the temperature of the pre-clean chamber by controlling one or more heating/cooling elements in the pre-clean chamber.

The control system 195 can be configured to control at least one of the composition, flow rate and/or pressure of deposition gases in the single wafer processing chamber 130 and/or the batch processing chamber 140. The control system 195 can be configured to control the temperature of a susceptor or substrate support or the temperature of the processing chamber 130, 140.

In one or more embodiments, the processor 196 may be one of any form of general-purpose computer processors that can be used in an industrial setting for controlling various manufacturing equipment used in semiconductor manufacturing. The memory 197 may be in the form of a computer-readable medium and may be one or more of readily available memory such as random access memory (RAM), read only memory (ROM), floppy disk, hard disk, or any other form of digital storage, local or remote. In one or more embodiments, support circuits 198 are coupled to the processor 196 for supporting the processor 196 in a conventional manner. These support circuits 198 can include cache, power supplies, clock circuits, input/output circuitry and subsystems, and the like.

In one or more embodiments, process routines for pre-cleaning or film deposition may generally be stored in the memory 197 as a software routine that, when executed by the processor 196, causes the processing platform 100 to perform processes disclosed herein. The software routine may also be stored and/or executed by a second processor (not shown) that is remotely located from the hardware being controlled by the processor 196. The software routine, when executed by the processor 196 causes the control system 195 to function as a specific purpose controller. When the control system 195 includes a computer, the control system 195 functions as a special purpose computer for controlling the processing platform 100 to perform the processes disclosed herein. Some embodiments of the disclosure process a substrate with the first surface and the second surface in a single processing chamber where in a first portion of the chamber, the substrate surfaces are exposed to the pre-clean plasma. The substrate may then be rotated to a second portion of the processing chamber, and/or subsequent portion of the processing chamber to deposit the metal film. To separate each or any of the portions, or regions, of the processing chamber, a gas curtain can be employed. The gas curtain provides one or more of purge gas and vacuum ports between the processing regions to prevent reactive gases from moving from one region to an adjacent region. In some embodiments, the substrate is exposed to more than one processing region at the same time, with one portion of the substrate in a first region (e.g., for pre-clean exposure) and another portion of the substrate at the same time being in a separate region of the processing chamber.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or the substrate can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system", and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants after forming the layer on the surface of the substrate. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

During processing, the substrate can be heated or cooled. Such heating or cooling can be accomplished by any suitable means including, but not limited to, changing the temperature of the substrate support (e.g., susceptor) and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

While the foregoing is directed to embodiments of the present disclosure, other and further embodiments of the disclosure may be devised without departing from the basic scope thereof, and the scope thereof is determined by the claims that follow.

What is claimed is:

1. A method of selectively depositing a film, the method comprising:
   providing a substrate having a first surface and a second surface different from the first surface;

exposing the substrate to a pre-clean plasma comprising one or more of argon or hydrogen to form a pre-cleaned substrate; and directly depositing a metal film selectively on the first surface of the pre-cleaned substrate relative to the second surface, the metal film deposited by chemical vapor deposition.

2. The method of claim 1, wherein the first surface and the second surface are substantially coplanar.

3. The method of claim 2, wherein the substrate provided has been previously subjected to a chemical-mechanical planarization process.

4. The method of claim 1, wherein the substrate is not exposed to air between pre-cleaning and deposition of the metal film.

5. The method of claim 4, wherein pre-cleaning and deposition of the metal film are performed within the same processing chamber.

6. The method of claim 1, wherein the first surface is a metal surface and the second surface is a dielectric surface.

7. The method of claim 6, wherein the metal surface comprises one or more of cobalt, copper, tungsten or ruthenium.

8. The method of claim 7, wherein the pre-clean plasma removes oxides from the metal surface.

9. The method of claim 1, wherein the metal film comprises one or more of tungsten, cobalt or copper.

10. The method of claim 1, wherein the metal film has a selectivity greater than or equal to about 50:1.

11. The method of claim 1, wherein the pre-clean plasma has a pressure in the range of about 10 mTorr to about 1 Torr.

12. The method of claim 1, wherein the pre-clean plasma is exposed to the substrate at a temperature about room temperature.

13. The method of claim 1, wherein the pre-clean plasma consists essentially of argon.

14. The method of claim 1, wherein the pre-clean plasma consists essentially of hydrogen.

15. The method of claim 1, wherein the metal film consists essentially of tungsten.

16. The method of claim 15, wherein the tungsten is deposited by a CVD process using $WF_6$ and $H_2$ at a temperature in the range of about 200° C. to 300° C. without plasma enhancement.

17. The method of claim 1, wherein the metal film has a selectivity 5 times greater than a metal film deposited by the same conditions on a substrate that has not been exposed to the pre-clean plasma.

18. A method of selectively depositing a film, the method comprising:

providing a substrate having a metal surface and a dielectric surface, the metal surface and the dielectric surface being substantially coplanar;

exposing the substrate to a pre-clean plasma to form a pre-cleaned substrate, the pre-clean plasma comprising one or more of argon or hydrogen at a pressure in the range of about 10 mTorr to about 1 Torr; and exposing the pre-cleaned substrate to deposition conditions to directly deposit a metal film, the metal film deposited by chemical vapor deposition with a selectivity of greater than or equal to about 50:1 on the metal surface relative to the dielectric surface.

19. The method of claim 18, wherein the metal surface comprises one or more of cobalt, copper, tungsten or ruthenium and the metal film comprises one or more of tungsten, cobalt or copper.

20. A method of selectively depositing a film, the method comprising:

providing a substrate having a cobalt surface and a dielectric surface, the cobalt surface and the dielectric surface being substantially coplanar;

exposing the substrate to a pre-clean plasma to form a pre-cleaned substrate, the pre-clean plasma comprising one or more of argon or hydrogen at a pressure in the range of about 10 mTorr to about 1 Torr and a temperature about room temperature; and exposing the pre-cleaned substrate to deposition conditions and directly depositing a tungsten film, the tungsten film being deposited with a selectivity of greater than or equal to about 50:1 on the cobalt surface relative to the dielectric surface, the deposition conditions comprising a thermal CVD process using $WF_6/H_2$ at a temperature in the range of about 200° C. to about 300° C.

* * * * *